(12) United States Patent
Park (10) Patent No.: US 11,177,398 B2
(45) Date of Patent: Nov. 16, 2021

(54) SOLAR CELL

(71) Applicant: University of Seoul Industry Cooperation Foundation, Seoul (KR)

(72) Inventor: Byung-Eun Park, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 322 days.

(21) Appl. No.: 15/042,652

(22) Filed: Feb. 12, 2016

(65) Prior Publication Data

US 2016/0163468 A1 Jun. 9, 2016

Related U.S. Application Data

(63) Continuation of application No. PCT/KR2014/007458, filed on Aug. 11, 2014.

(30) Foreign Application Priority Data

Aug. 14, 2013 (KR) .......... 10-2013-0096549

(51) Int. Cl.
*H01L 31/00* (2006.01)
*H01L 31/0224* (2006.01)
*H01L 31/06* (2012.01)

(52) U.S. Cl.
CPC ........ *H01L 31/022425* (2013.01); *H01L 31/022466* (2013.01); *H01L 31/06* (2013.01); *Y02E 10/542* (2013.01)

(58) Field of Classification Search
CPC ............ H01L 31/0224; H01L 31/022416
(Continued)

(56) References Cited

U.S. PATENT DOCUMENTS 4,231,053 A * 10/1980 Schoolar ............... H01L 27/142
136/252
4,312,114 A * 1/1982 Schoolar ........... H01L 31/02024
136/255
(Continued)

FOREIGN PATENT DOCUMENTS

| JP | 09-213987 A | 8/1997 |
|---|---|---|
| KR | 10-0786855 B1 | 12/2007 |
| KR | 10-2010-0128727 A | 12/2010 |

*Primary Examiner* — Thanh Truc Trinh
(74) *Attorney, Agent, or Firm* — Nelson Mullins Riley & Scarborough LLP; Kongsik Kim, Esq.

(57) ABSTRACT

A silicon solar cell with high photoelectric conversion efficiency is disclosed. A solar cell for converting light incident from an outside into electricity according to the present invention includes a substrate, a lower electrode, a ferroelectric layer, an auxiliary electrode, a first conductivity-type semiconductor layer, a second conductivity-type semiconductor layer, and an upper electrode. The lower electrode is formed on the substrate. The ferroelectric layer is formed on the substrate and outside the lower electrode. The auxiliary electrode is formed on the ferroelectric layer. The first conductivity-type semiconductor layer is formed on the lower electrode and the auxiliary electrode. The second conductivity-type semiconductor layer is formed on the first conductivity-type semiconductor layer, and is composed of a semiconductor of a second conductivity type opposite to a first conductivity type. The upper electrode is made of transparent conductive material, and is formed on the second conductivity-type semiconductor layer.

4 Claims, 6 Drawing Sheets

(58) Field of Classification Search
USPC .................................................. 136/243–293
See application file for complete search history.

(56) References Cited

U.S. PATENT DOCUMENTS

| | | | |
|---|---|---|---|
| 6,081,017 A | 6/2000 | Kim et al. | |
| 6,639,143 B2* | 10/2003 | Kim | H01L 31/068 |
| | | | 136/252 |
| 2011/0303278 A1* | 12/2011 | Fu | H01L 31/074 |
| | | | 136/256 |
| 2013/0221415 A1* | 8/2013 | Regan | H01L 29/68 |
| | | | 257/288 |

* cited by examiner

SOLAR CELL

CROSS-REFERENCE TO RELATED APPLICATION

This application is a continuation of PCT/KR2014/007458 filed on Aug. 11, 2014, which claims priority to Korean Application No. 10-2013-0096549 filed on Aug. 14, 2013, which applications are incorporated herein by reference.

TECHNICAL FIELD

The present invention relates generally to a solar cell, and more particularly to a silicon solar cell with high photoelectric conversion efficiency.

BACKGROUND ART

Recently, as interest in clean energy has increased, interest in the generation of power using solar light has also increased considerably.

A device for generating power using solar energy is commonly referred to as a "solar cell." Such solar cells may be basically classified into silicon solar cells and dye-sensitized solar cells according to their structure.

A silicon solar cell has a PN junction structure. When light is radiated onto this solar cell from the outside, a pair of an electron and a hole is formed inside a semiconductor, and the electron and the hole are moved to an N-type semiconductor layer and a P-type semiconductor layer, respectively, by an electric field generated in the PN junction, thereby generating power.

Conventionally, a scheme using ferroelectric material has been proposed as a means for increasing the efficiency of a silicon solar cell. This is configured such that a ferroelectric layer is formed inside a solar cell and the area of the depletion layer of the solar cell is extended using the polarization phenomenon of the ferroelectric layer, thereby enabling electron-hole recombination rate in a PN junction surface to be reduced.

Korean Patent No. 10-0786855 discloses a structure in which a ferroelectric layer is formed in the entire upper or lower side of a solar cell. However, when the ferroelectric layer is formed in the upper side of the solar cell, the ferroelectric layer reduces the amount of solar light incident upon the solar cell, with the result that a problem arises in that the efficiency of the solar cell is degraded. Meanwhile, when the ferroelectric layer is formed in the entire lower side of the solar cell, a sufficient electrical contact area is not provided between the semiconductor layer and the lower electrode of the solar cell, and thus the flow of electrons or holes is restricted, with the result that a problem arises in that the efficiency of the solar cell is degraded.

SUMMARY OF THE DISCLOSURE

Accordingly, the present invention has been made keeping in mind the above problems occurring in the prior art, and an object of the present invention is to provide a solar cell that is capable of effectively improving the efficiency of the solar cell.

According to a first aspect of the present invention, there is provided a solar cell for converting light incident from an outside into electricity, the solar cell including: a substrate; a lower electrode formed on the substrate; a ferroelectric layer formed on the substrate and outside the lower electrode; an auxiliary electrode formed on the ferroelectric layer; a first conductivity-type semiconductor layer formed on the lower electrode and the auxiliary electrode; a second conductivity-type semiconductor layer formed on the first conductivity-type semiconductor layer and composed of a semiconductor of a second conductivity type opposite to a first conductivity type; and an upper electrode made of transparent conductive material and formed on the second conductivity-type semiconductor layer.

According to a second aspect of the present invention, there is provided a solar cell for converting light incident from an outside into electricity, the solar cell including: a substrate; a ferroelectric layer formed on the substrate; a lower electrode formed on the substrate and outside the ferroelectric layer; an auxiliary electrode formed on the ferroelectric layer; a first conductivity-type semiconductor layer formed on the lower electrode and the auxiliary electrode; a second conductivity-type semiconductor layer formed on the first conductivity-type semiconductor layer and composed of a second conductivity-type semiconductor of a conductivity type opposite to a first conductivity type; and an upper electrode made of transparent conductive material and formed on the second conductivity-type semiconductor layer.

The ferroelectric layer may be formed while coating the auxiliary electrode.

The ferroelectric layer may be made of one of inorganic ferroelectric material, a mixture of inorganic ferroelectric material and organic ferroelectric material, and organic ferroelectric material.

The ferroelectric material may be mixed with metallic material.

The ferroelectric layer may be polarized by the upper electrode and the auxiliary electrode.

According to a third aspect of the present invention, there is provided a solar cell for converting light incident from an outside into electricity, the solar cell including: a substrate; a lower electrode formed on the substrate; a first conductivity-type semiconductor layer formed on the lower electrode; a second conductivity-type semiconductor layer formed on the first conductivity-type semiconductor layer and composed of a second conductivity-type semiconductor of a conductivity type opposite to a first conductivity type; an upper electrode made of transparent conductive material and formed on the second conductivity-type semiconductor layer; a ferroelectric layer formed on the second conductivity-type semiconductor layer and outside the upper electrode; and an auxiliary electrode formed on the ferroelectric layer.

According to a fourth aspect of the present invention, there is provided a solar cell for converting light incident from an outside into electricity, the solar cell including: a substrate; a lower electrode formed on the substrate; a first conductivity-type semiconductor layer formed on the lower electrode; a second conductivity-type semiconductor layer formed on the first conductivity-type semiconductor layer and composed of a second conductivity-type semiconductor of a conductivity type opposite to a first conductivity type; a ferroelectric layer formed on the second conductivity-type semiconductor layer; an upper electrode formed of transparent conductive material and formed on the second conductivity-type semiconductor layer and outside the ferroelectric layer; and an auxiliary electrode formed on the ferroelectric layer.

The ferroelectric layer may be made of one of inorganic ferroelectric material, a mixture of inorganic ferroelectric material and organic ferroelectric material, and organic ferroelectric material.

The ferroelectric material may be mixed with metallic material.

The ferroelectric layer may be polarized by the lower electrode and the auxiliary electrode.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE DISCLOSURE

Hereinafter, embodiments of the present invention will be described in detail with reference to the accompanying drawings. The following embodiments are intended merely to illustrate some exemplary implementations of the present invention, and are not intended to limit the range of the rights of the present invention. The present invention may be implemented in various modified forms without departing from the technical spirit of the present invention.

Figure 1:
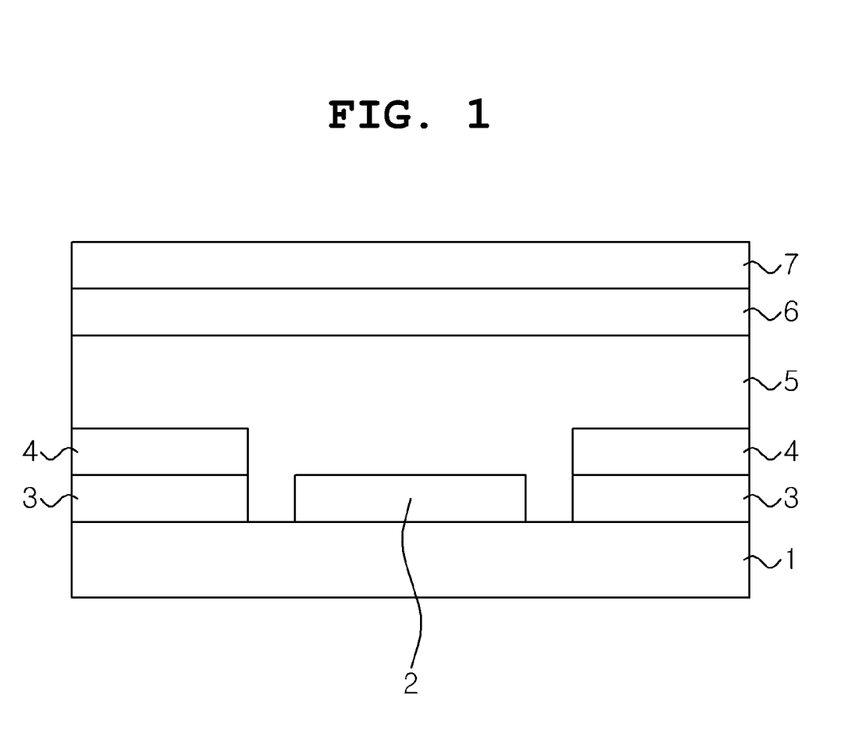
FIG. 1 is a sectional view showing the structure of a solar cell according to a first embodiment of the present invention.

FIG. 1 is a sectional view showing the structure of a solar cell according to a first embodiment of the present invention.

In this drawing, a lower electrode 2 and an auxiliary electrode 3 are disposed on a substrate 1. The lower electrode 2 enables the flow of electrons or holes generated by the solar cell in the same manner as in a common solar cell. The auxiliary electrode 3 functions to polarize a ferroelectric layer 4, which will be described later.

Figure 2:
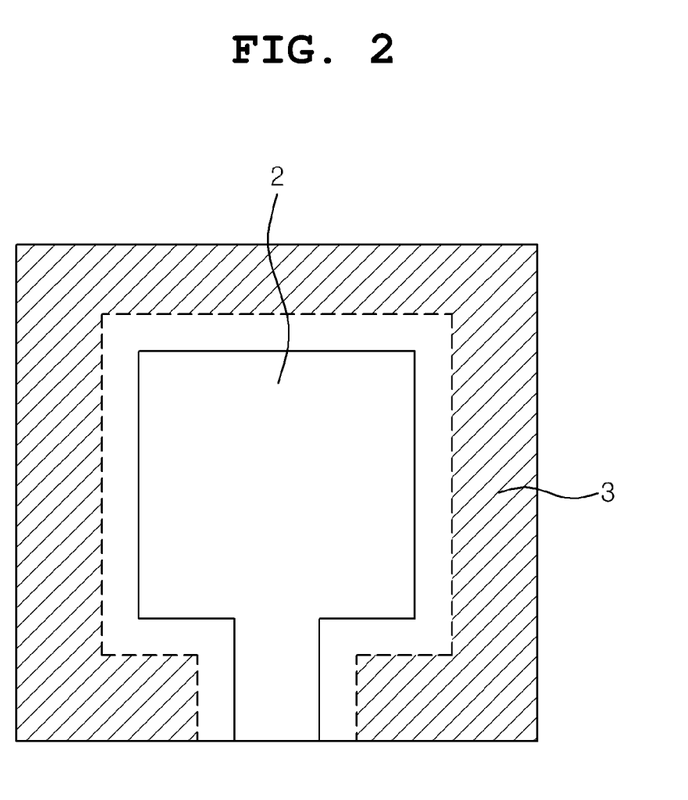
FIG. 2 is a plan view showing the layout of a lower electrode and an auxiliary electrode disposed on the substrate shown in FIG. 1.

FIG. 2 is a plan view showing the layout of the lower electrode 2 and the auxiliary electrode 3 disposed on the substrate 1. The auxiliary electrode 3 is disposed along the periphery of the lower electrode 2. Furthermore, in the drawing, the shapes of the lower electrode 2 and the auxiliary electrode 3 are not limited to specific shapes. For example, the lower electrode 2 may be configured in a circular shape, and the inside surface of the auxiliary electrode 3 may be configured in a circular shape.

The ferroelectric layer 4 made of ferroelectric material is formed on the auxiliary electrode 3, and a first conductivity-type semiconductor layer 5 is entirely formed on the ferroelectric layer 4 and the substrate 1 of the lower electrode 2.

Furthermore, in a variation of the present embodiment, an insulating layer may be formed between the auxiliary electrode and the lower electrode 2, or preferably, when the ferroelectric layer 4 is formed on the auxiliary electrode 3, the ferroelectric layer 4 may be formed to entirely coat the auxiliary electrode 3.

As the ferroelectric material of which the ferroelectric layer 4 is made of, for example, organic ferroelectric material, a mixture of organic ferroelectric material and organic material, a mixture of organic ferroelectric material and metal, a mixture of organic material and inorganic ferroelectric material, a mixture of organic ferroelectric material and inorganic ferroelectric material, or the like may be adopted.

A second conductivity-type semiconductor layer 6 of a conductivity type opposite to a first conductivity type is formed on the first conductivity-type semiconductor layer 5, and an upper electrode 7 made of material with excellent transparency is formed on the second conductivity-type semiconductor layer 6. In this case, as the material of which the upper electrode 7 is made of, for example, conductive organic material, or a mixture of conductive organic material and conductive inorganic material, as well as ITO, TCO, FTO, ZnO, or CNT, may be adopted.

In the above-described structure, the ferroelectric layer 4 is polarized using the upper electrode 7 and the auxiliary electrode 3, prior to the operation of the solar cell. Once the ferroelectric layer 4 has been polarized, the area of a depletion layer generated in a PN junction between the first conductivity-type semiconductor layer 5 and the second conductivity-type semiconductor layer 6 is extended by a polarization electric field generated due to the polarization, with the result that the electron-hole recombination rate in a boundary surface is reduced. Furthermore, the flows of electrons and holes are expedited by the polarization electric field from the ferroelectric layer 4, and thus the efficiency of the solar cell is significantly improved.

Figure 3:
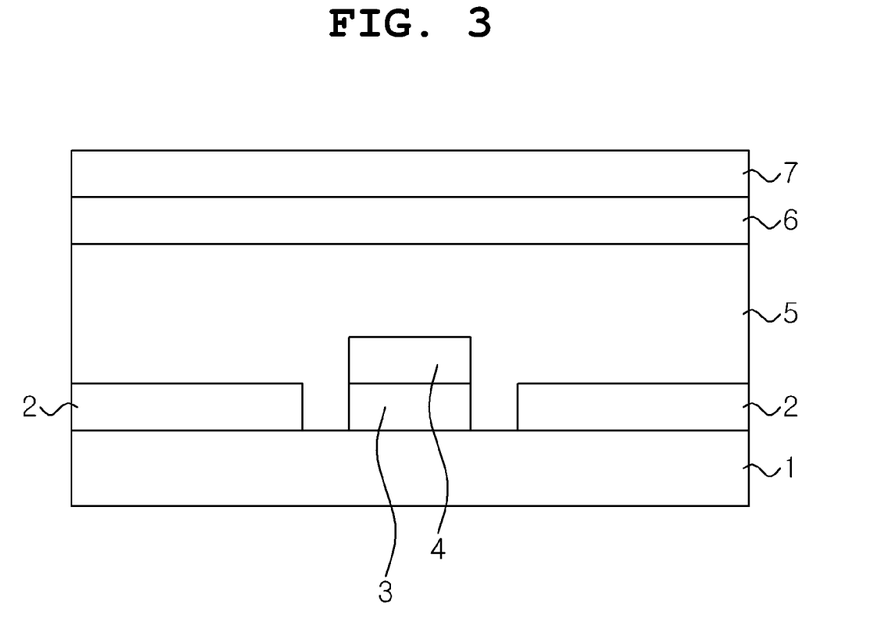
FIG. 3 is a sectional view showing the sectional structure of a solar cell according to a second embodiment of the present invention.
Figure 4:
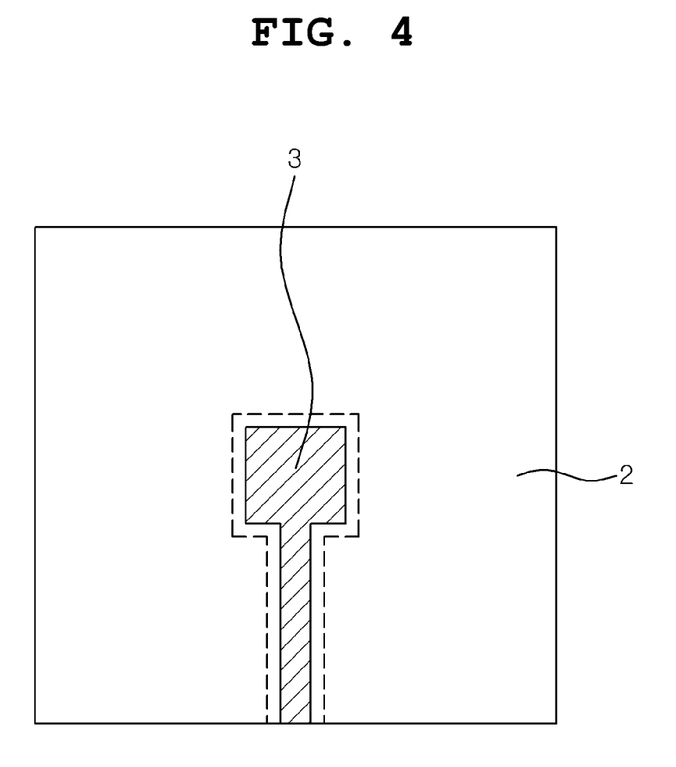
FIG. 4 is a plan view showing the principal portion of the solar cell shown in FIG. 3.

FIG. 3 is a sectional view showing the sectional structure of a solar cell according to a second embodiment of the present invention. Furthermore, FIG. 4 is a plan view showing the principal portion of FIG. 3, and corresponds to FIG. 2.

In the embodiment of FIG. 1, the lower electrode 2 is disposed in the lower center portion of the solar cell, and the auxiliary electrode 3 and the ferroelectric layer 4 are formed outside the lower electrode 2. In contrast, in the present embodiment, an auxiliary electrode 3 and a ferroelectric layer 4 are disposed in the lower center portion of the solar cell, and the lower electrode 2 is disposed outside the auxiliary electrode 2 and the ferroelectric layer 4.

Furthermore, in the present embodiment, an insulating layer may be formed between the auxiliary electrode 3 and the lower electrode 2, or preferably, when the ferroelectric layer 4 is formed on the auxiliary electrode 3, the ferroelectric layer 4 may be formed to entirely coat the auxiliary electrode 3 in the same manner as in the embodiment of FIG. 1.

Furthermore, in the present embodiment, the shapes of the lower electrode 2 and the auxiliary electrode 3 are not limited to specific shapes, but may be appropriately modified and practiced.

Furthermore, since the other portions are substantially the same as those of the above-described first embodiment, the same reference symbols are assigned to the same components, and detailed descriptions thereof are omitted.

Figure 5:
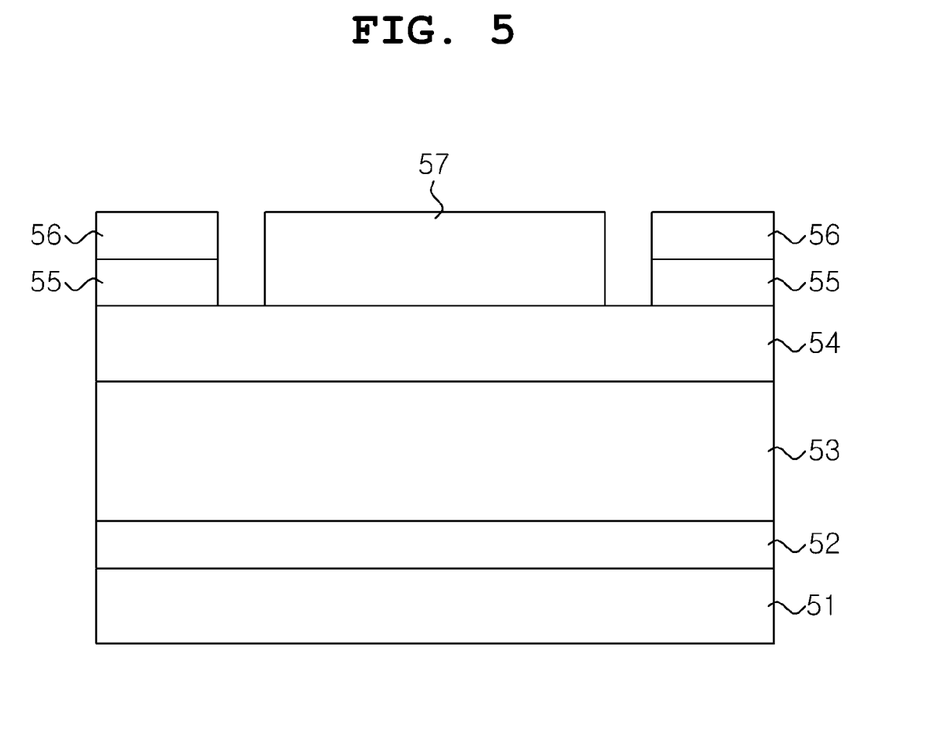
FIG. 5 is a sectional view showing the structure of a solar cell according to a third embodiment of the present invention.

FIG. 5 is a sectional view showing the structure of a solar cell according to a third embodiment of the present invention.

In the above-described embodiment, the auxiliary electrode 3 and the ferroelectric layer 4 are disposed in the lower portion of the solar cell. In contrast, in the present embodiment, a ferroelectric layer 55 and an auxiliary electrode 56 are disposed in the upper portion of the solar cell.

In the present embodiment, a lower electrode 52 is disposed on a substrate 51 in the same manner as in a common solar cell, and a first conductivity-type semiconductor layer 53 and a second conductivity-type semiconductor layer 54 of a conductivity type opposite to a first conductivity type are sequentially stacked on the lower electrode 52.

Meanwhile, in the present embodiment, a ferroelectric layer 55 and an upper electrode 57 are disposed on the second conductivity-type semiconductor layer 53, and an auxiliary electrode 56 is disposed on the ferroelectric layer 55. In this case, the ferroelectric layer 55, the auxiliary electrode 56 and the upper electrode 57 are arranged such that the upper electrode 57 is disposed in the center portion and the ferroelectric layer 55 and the auxiliary electrode 56 are disposed outside the upper electrode 57 in the same manner as in the plan view of FIG. 2. Furthermore, in this case, the shapes of the upper electrode 57, the ferroelectric layer 55 and the auxiliary electrode 56 are not limited to specific shapes.

Furthermore, the upper electrode 57 is made of transparent material in the same manner as in a common solar cell, and the auxiliary electrode 56 is not made of specific material.

In the present embodiment, during the operation of the solar cell, the ferroelectric layer 55 is polarized using the auxiliary electrode 56 and the lower electrode 52. Furthermore, since the other operations are the same as those of the above-described embodiment, detailed descriptions thereof are omitted.

Figure 6:
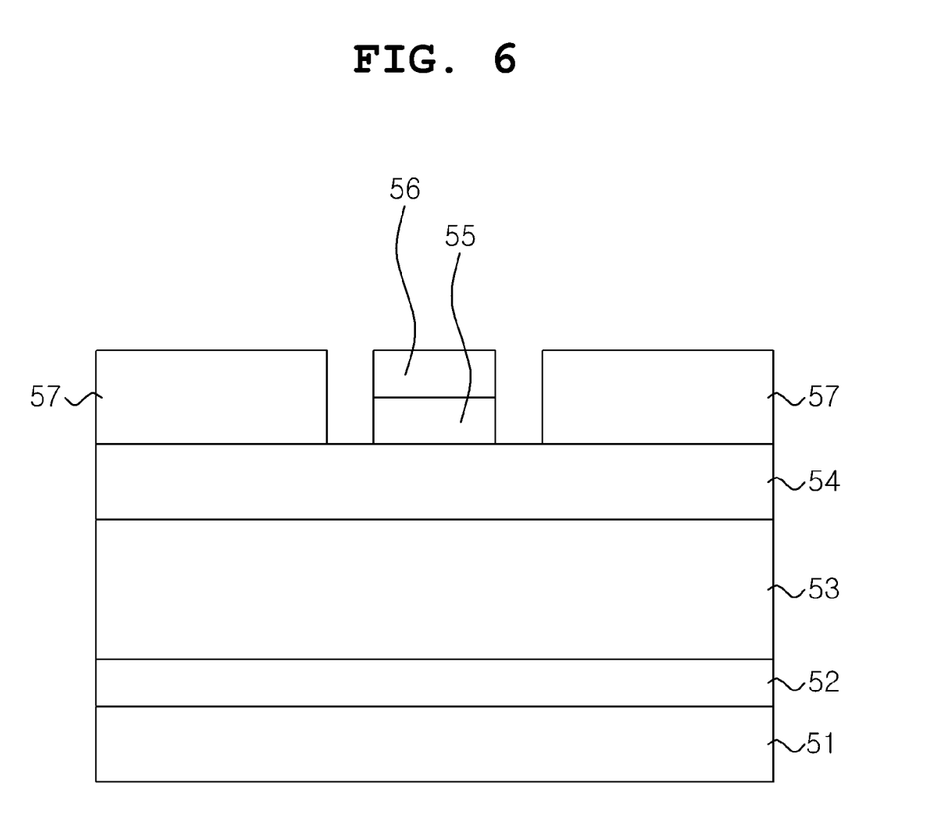
FIG. 6 is a sectional view showing the structure of a solar cell according to a fourth embodiment of the present invention.

FIG. 6 is a sectional view showing the structure of a solar cell according to a fourth embodiment of the present invention.

In the present embodiment, a ferroelectric layer 55 and an auxiliary electrode 56 are disposed in the upper portion of the solar cell in the same manner as in the embodiment of FIG. 5, and the ferroelectric layer 55 and the auxiliary electrode 56 are disposed in the center portion of the solar cell and an upper electrode 57 is disposed outside the ferroelectric layer 55 and the auxiliary electrode 56 in the same manner as in the embodiment of FIG. 3.

Furthermore, since the other portions are the same as those of the above-described embodiment of FIG. 5, the same reference symbols are assigned to the substantially same components, and detailed descriptions thereof are omitted.

As described above, according to the present invention, there is no influence on the amount of solar light incident upon the solar cell, and the contact area between the first or second conductivity-type semiconductor layer 53 or 54 and the lower electrode 2 or 52 or upper electrode 7 or 57 can be maximized. Accordingly, the photoelectric conversion efficiency of the solar cell is significantly improved.

Embodiments of the present invention have been described above. However, the present invention is not limited to the above-described embodiment, but may be modified and practiced in various manners without departing from the technical spirit of the present invention.

What is claimed is:

1. A solar cell for converting light incident from an outside into electricity, the solar cell comprising:
   a substrate;
   a lower electrode formed on an upper surface of the substrate;
   an auxiliary electrode formed on the upper surface of the substrate and outside the lower electrode;
   a ferroelectric layer formed on an upper surface of the auxiliary electrode and spaced apart from the lower electrode;
   a first conductivity-type semiconductor layer having a first conductivity type formed on the lower electrode and the ferroelectric layer;
   a second conductivity-type semiconductor layer formed on an upper surface of the first conductivity-type semiconductor layer and having a second conductivity type opposite to the first conductivity type; and
   an upper electrode made of transparent conductive material and formed on an upper surface of the second conductivity-type semiconductor layer,
   wherein the ferroelectric layer is polarized by the upper electrode and the auxiliary electrode,
   wherein the first conductivity-type semiconductor layer is formed to be in direct contact with an entire upper surface of the ferroelectric layer, an inner side surface of the ferroelectric layer, and an inner side surface of the auxiliary electrode,
   wherein the auxiliary electrode substantially surrounds the lower electrode in a plan view, and
   wherein the ferroelectric layer substantially surrounds the lower electrode in the plan view by entirely coating the upper surface of the auxiliary electrode.

2. The solar cell of claim 1, wherein the ferroelectric layer is formed as a coating on the upper surface of the auxiliary electrode.

3. The solar cell of claim 1, wherein the ferroelectric layer is made of one of inorganic ferroelectric material, a mixture of inorganic ferroelectric material and organic ferroelectric material, and organic ferroelectric material.

4. The solar cell of claim 3, wherein the ferroelectric material is mixed with metallic material.

* * * * *